(12) United States Patent
Amedeo et al.

(10) Patent No.: US 7,619,440 B2
(45) Date of Patent: Nov. 17, 2009

(54) CIRCUIT HAVING LOGIC STATE RETENTION DURING POWER-DOWN AND METHOD THEREFOR

(75) Inventors: Robert J. Amedeo, Austin, TX (US); Christopher K. Y. Chun, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/022,199

(22) Filed: Jan. 30, 2008

(65) Prior Publication Data

US 2009/0189636 A1    Jul. 30, 2009

(51) Int. Cl.
H03K 17/16    (2006.01)
H03K 19/003    (2006.01)

(52) U.S. Cl. .......................... 326/33; 326/112; 326/119
(58) Field of Classification Search .................. 327/544
See application file for complete search history.

(56) References Cited

U.S. PATENT DOCUMENTS

| | | | |
|---|---|---|---|
| 5,726,946 A | 3/1998 | Yamagata et al. | |
| 6,049,245 A | 4/2000 | Son et al. | |
| 6,476,641 B2* | 11/2002 | Yoshida | 326/83 |
| 6,977,519 B2 | 12/2005 | Bhavnagarwala et al. | |
| 7,126,370 B2 | 10/2006 | Bhattacharya | |
| 7,170,327 B2 | 1/2007 | Aksamit | |
| 7,271,615 B2 | 9/2007 | Afghahi et al. | |
| 2004/0227542 A1 | 11/2004 | Bhavnagarwala et al. | |
| 2007/0121358 A1* | 5/2007 | Hirota et al. | 365/1 |

* cited by examiner

*Primary Examiner*—Anh Q Tran
(74) *Attorney, Agent, or Firm*—Daniel D. Hill; Robert L. King

(57) ABSTRACT

A storage circuit has an input for receiving and storing data, a first power terminal coupled to a first conductor for receiving a first power supply voltage, and a second power terminal coupled to a second conductor. A power gate device has a first terminal coupled to the second conductor, a control terminal for receiving a bias voltage in response to a control signal, and a second terminal coupled to a terminal for receiving a second power supply voltage. A shorting device selectively electrically short circuits the first terminal of the power gate device to the control terminal of the power gate device in response to the control signal, thereby converting the power gate device from a transistor into a diode-connected device. The shorting device is smaller in size than the power gate device.

18 Claims, 2 Drawing Sheets

CIRCUIT HAVING LOGIC STATE RETENTION DURING POWER-DOWN AND METHOD THEREFOR

BACKGROUND

1. Field

This disclosure relates generally to logic state retention, and more specifically, to a circuit having logic state retention during a power-down mode and method therefor.

2. Related Art

Lower power consumption has been gaining importance in integrated circuit data processing systems due to, for example, wide spread use of portable and handheld applications. Most circuits in handheld devices are typically off (e.g., in an idle or deep sleep mode) for a significant portion of time, consuming only leakage power. As transistor leakage currents increase with finer geometry manufacturing processes, it becomes more difficult to meet chip leakage targets using traditional power reduction techniques. Therefore, reducing leakage current is becoming an increasingly important factor in extending battery life.

One method that has been used to reduce leakage current of integrated circuits is to increase the threshold voltage of the transistors in the device. However, simply increasing the threshold voltage of the transistors may result in unwanted consequences such as slowing the operating speed of the device and limiting circuit performance.

Another method that has been used to reduce leakage current is to "power gate", or cut off power to certain blocks of the integrated circuit that are not needed when the integrated circuit is in a low power mode. However, in doing so, the state of the circuit block is lost. In many circuit blocks state retention is needed in order to prevent loss of important information and allow for proper circuit operation and performance when recovering from a low power mode. Many state retention flip-flop circuits incorporate an additional storage mechanism to retain a logic state during power gating. However, the additional devices that are required to implement the state retention storage mechanism can significantly increase the amount of surface area on an integrated circuit.

Another way to provide state retention during a power gate mode without using an additional storage mechanism is to provide a reduced power supply voltage to the flip-flops while removing the power supply voltage from the rest of the circuit. The reduced power supply voltage further reduces a leakage current, thus lowering power consumption even more. However, this method for power gating requires the routing of two or more power supplies, and at least two relatively large header and/or footer devices for each routing that take up a significant amount of surface area on integrated circuit.

Therefore, what is needed is a circuit and method that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
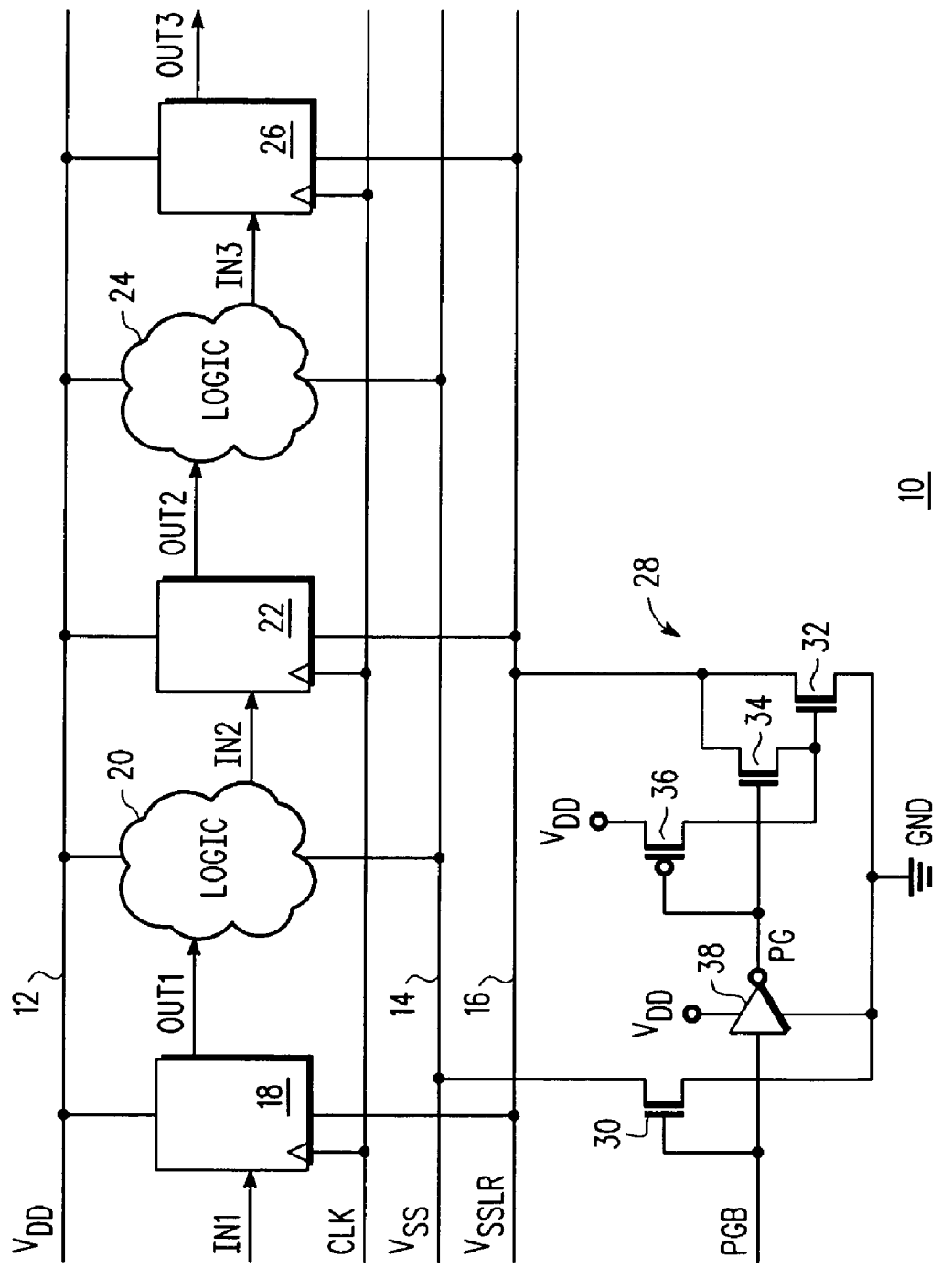
FIG. 1 illustrates, in partial logic diagram form and partial schematic diagram form, a portion of an integrated circuit in accordance with an embodiment.

Generally, there is provided, a circuit for providing a power down mode that includes a footer device that is selectively configured to function as a diode or a pass transistor. The footer device can be configured as a diode having a relatively higher resistance during a power gating mode or as a pass device having a relatively lower resistance during a normal operating mode. The use of a single configurable footer device reduces the surface area on an integrated circuit used to implement power gating. Also, the use of a single footer device reduces leakage current during power down mode while still retaining a logic state and using less surface area.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by the letter "B" at the end of the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

In one aspect, there is provided, a circuit comprising: a storage circuit having an input for receiving and storing data and having a first power terminal coupled to a first conductor for receiving a first power supply voltage and having a second power terminal coupled to a second conductor; a power gate device having a first terminal coupled to the second conductor, a control terminal for receiving a bias voltage in response to a control signal, and a second terminal coupled to a terminal for receiving a second power supply voltage; and a shorting device for selectively electrically short circuiting the first terminal of the power gate device to the control terminal of the power gate device in response to the control signal, thereby converting the power gate device from a transistor into a diode-connected device. In another embodiment, the circuit further comprises a logic circuit portion having an input coupled to an output of the storage circuit, the logic circuit portion having a first power terminal coupled to the first conductor and a second power terminal coupled to a third conductor, the storage circuit retaining a state of an input signal to the logic circuit portion when electrical power to the logic circuit portion is gated from at least one of the first power supply voltage and the second power supply voltage in response to the control signal. The circuit may further comprise an inverter having an input for receiving the control signal and an output for providing the control signal in inverted form that is coupled to the control terminal of the shorting device; a first transistor having a first current electrode for receiving the first power supply voltage, a control electrode coupled to the output of the inverter for receiving the control signal in inverted form and a second current electrode coupled to the control terminal of the power gate device for providing the bias voltage; and a second transistor having a first current electrode coupled to the third conductor, a control electrode for receiving the control signal, and a second current electrode coupled to the terminal for receiving the second power supply voltage. Also, the shorting device may further comprise a transistor having a first current electrode connected directly to the first terminal of the power gate device, a control electrode for receiving the control signal, and a second current electrode connected directly to the control electrode of the power gate device. The control electrode of the shorting device may comprise a first width and the control electrode of the power gate device may comprise a second width, the first width being no greater than ninety percent of the second width. In addition, the control electrode of the shorting device may comprise a first width and the control electrode of the power gate device comprises a second width, the first width being no greater than ten percent of the second width. Further, the control electrode of the shorting device may comprise a first width and the control electrode of the power gate device comprises a second width, the first width being no greater than one percent of the second width. The power gate device may be a footer device for selectively gating a lower magnitude supply voltage of the first power supply voltage and the second power supply voltage to the storage circuit.

In another aspect, there is provided, a method comprising: providing a storage circuit having an input for receiving and storing data and having a first power terminal coupled to a first conductor for receiving a first power supply voltage, the storage circuit having a second power terminal coupled to a second conductor; providing a power gate device having a first terminal coupled to the second conductor, a control terminal for receiving a bias voltage in response to a control signal, and a second terminal coupled to a terminal for receiving a second power supply voltage; and selectively electrically short circuiting the first terminal of the power gate device to the control terminal of the power gate device in response to the control signal, thereby converting the power gate device from a transistor into a diode-connected device. The method may further comprise coupling an input of a logic circuit portion to an output of the storage circuit, the logic circuit portion having a first power terminal coupled to the first conductor and a second power terminal coupled to a third conductor, the storage circuit retaining a state of an input signal to the logic circuit portion when electrical power to the logic circuit portion is gated from at least one of the first power supply voltage and the second power supply voltage in response to the control signal. Also, the method may further comprise: providing an inverter for receiving the control signal, the inverter having an output for providing the control signal in inverted form that is coupled to the control terminal of the shorting device; providing a first transistor having a first current electrode for receiving the first power supply voltage, a control electrode coupled to the output of the inverter for receiving the control signal in inverted form and a second current electrode coupled to the control terminal of the power gate device for providing the bias voltage; and providing a second transistor having a first current electrode coupled to the third conductor, a control electrode for receiving the control signal, and a second current electrode coupled to the terminal for receiving the second power supply voltage. In addition, the method may further comprise: providing a transistor as the shorting device; connecting a first current electrode of the transistor directly to the first terminal of the power gate device; providing a control electrode for receiving the control signal; and connecting a second current electrode of the transistor directly to the control electrode of the power gate device. The method may further comprise: forming the control electrode of the shorting device to have a first width; forming the control electrode of the power gate device to have a second width; and forming the first width to be no greater than ninety percent of the second width. The method may further comprise: forming the control electrode of the shorting device to have a first width; forming the control electrode of the power gate device to have a second width; and forming the first width to be no greater than ten percent of the second width. The method may further comprise: forming the current electrode of the shorting device to have a first width; forming the current electrode of the power gate device to have a second width; and forming the first width to be no greater than one percent of the second width. The method may further comprise: forming the power gate device as a footer device for selectively gating a lower magnitude supply voltage of the first power supply voltage and the second power supply voltage to the storage circuit.

In yet another aspect, there is provided, a circuit, comprising: first, second and third power conductors and a voltage terminal; a storage circuit comprising a first power terminal coupled to the first power conductor and a second power terminal coupled to the second power conductor; a first power gate select transistor having a first electrode coupled to the second conductor, a control electrode, and a second electrode coupled to the voltage terminal; a shorting transistor having a first electrode connected directly to the first electrode of the first power gate select transistor, a control electrode, and a second current electrode connected directly to the control electrode of the first power gate select transistor; an inverter having an input for receiving a control signal and having an output coupled to the control electrode of the first power gate select transistor for providing the control signal after a logic value inversion; a biasing transistor coupled to the inverter and the control electrode of the power gate select transistor for providing a bias voltage to the first power gate select transistor in response to the control signal; and a second power gate select transistor comprising a first current electrode coupled to the third power conductor, a second current electrode coupled to the voltage terminal, and a control electrode for receiving the control signal. The control electrode of the shorting transistor may further comprise a first width, the control electrode of the first power gate select transistor comprises a second width, and the first width is no greater than ninety percent of the second width. The control electrode of the shorting transistor may further comprise a first width, the control electrode of the first power gate select transistor comprises a second width, and the first width is no greater than ten percent of the second width. The control electrode of the shorting transistor may further comprise a first width, the control electrode of the first power gate select transistor comprises a second width, and the first width is no greater than one percent of the second width.

FIG. 1 illustrates, in partial logic diagram form and partial schematic diagram form, a circuit portion 10 of an integrated circuit in accordance with an embodiment. Circuit portion 10 includes power supply conductors 12, 14, and 16, flip-flops 18, 22, and 26, logic circuits 20 and 24, and power gating circuit 28. Power gating circuit 28 includes N-channel transistors 30, 32, and 34, P-channel transistor 36 and inverter 38.

Circuit portion 10 is a simplified representation of an integrated circuit having a normal operating mode and a power down, or power gating, mode. The integrated circuit may be a microprocessor, a microcontroller, a memory, or other type of integrated circuit that processes or stores data. In another embodiment, circuit portion 10 may be distributed across several integrated circuits. As illustrated in FIG. 1, the integrated circuit includes logic circuit portions coupled to flip-flop circuits. The logic circuit portions can include any type of logic for processing data. Flip-flop circuits, such as flip-flops 18, 22, and 26, are distributed among the logic circuits and at least partially function as storage circuits to retain logic states during power down mode that are necessary for proper operation when the integrated circuit is returned to normal mode. The integrated circuit includes two power supply voltage levels, or magnitudes, a normal power supply level between VDD and VSS for operating in the normal operating mode, and a leakage retention power supply voltage level between VDD and VSSLR for operating in the power gating mode. The leakage retention power supply voltage is offset by a diode threshold voltage (VT) and is less than the normal power supply voltage. The leakage retention power supply voltage is only provided to the state retention flip-flop circuits and is lowered to reduce a leakage current still further. More specifically, as illustrated in FIG. 1, power supply conductor 12 conducts the power supply voltage labeled "VDD", power supply conductor 14 conducts the power supply voltage labeled "VSS", and power supply conductor 16 conducts the leakage retention power supply voltage labeled "VSSLR". Power supply conductor 12 (VDD) is coupled to each of flip-flops 18, 22, and 26, and to logic circuits 20 and 24. Power supply conductor 14 (VSS) is coupled to those circuits that have their power supply voltages removed during power gating mode, and power supply conductor 16 (VSSLR) is coupled to those circuits that require a lowered power supply voltage to, for example, retain a logic state necessary for the integrated circuit to return to normal operation at the end of the low power, or power gating, mode of operation. Power supply conductor 14 is coupled to logic circuit portions 20 and 24 and power supply conductor 16 is coupled to flip-flops 18, 22, and 26. Each of flip-flops 18, 22, and 26 has a clock input for receiving a clock signal labeled "CLK". Flip-flop 18 has an input for receiving an input signal labeled "IN1", and an output for providing an output signal labeled "OUT1" to an input of logic circuit 20. Flip-flop 22 has an input coupled to an output of logic circuit 20 for receiving a signal labeled "IN2", and an output for providing a signal labeled "OUT2". Flip-flop 26 has an input coupled to an output of logic circuit 24 for receiving a signal labeled "IN3", and an output for providing a signal labeled "OUT3".

Flip-flops 18, 22, and 26 are conventional state retention flip-flops having a master latch coupled to a slave latch (not shown). In the illustrated embodiment, the flip-flops 18, 22, and 26 provide logic state retention without using an additional dedicated state retention latch. In other embodiments, the state retention flip-flop may include a third, dedicated, state retention latch. Also, in another embodiment, the state retention flip-flops may be replaced with another type of storage circuit. Note that in the illustrated embodiment, VDD is a positive power supply voltage such as 1.2 volts, and VSS and VSSLR are both coupled to ground during the normal operating mode. During the power gating operating mode, VDD is a positive power supply voltage and power supply voltage terminal VSSLR is raised to about one VT above ground by converting device 32 from functioning as a transistor to functioning as a diode-connected transistor. Power supply voltage VDD can be at the same power supply voltage level during both modes or can be different. For example, VDD can be lower in the power gating mode to further reduce leakage. In other embodiments, the power supply voltages can be different, for example, VDD may be ground and VSS and VSSLR may be positive voltages. Note that the application of different power supply voltages in other embodiments may require the conductivity types of the transistors in power gating circuit 28 to be changed.

In power gating circuit 28, N-channel transistor 30 has a drain (current electrode) coupled to conductor 14 for receiving power supply voltage VSS, a gate (control electrode) for receiving a power gating enable signal labeled "PGB", and a source (current electrode) coupled to a ground terminal labeled "GND". N-channel transistor 32 has a drain coupled to power supply conductor 16, a gate, and a source coupled to the ground terminal GND. N-channel transistor 34 has a drain coupled to the drain of N-channel transistor 32, a gate, and a source coupled to the gate of N-channel transistor 32. P-channel transistor 36 has a source coupled to receive the power supply voltage VDD, a gate coupled to the gate of N-channel transistor 34, and a drain coupled to the gate of N-channel transistor 32. Inverter 38 has an input terminal coupled to receive the power gating enable signal PCB, and an output terminal for providing an inverted signal labeled "PG" to the gates of P-channel transistor 36 and N-channel transistor 34. In response to signal PG, transistor 36 functions as a biasing transistor to provide a bias voltage to the gate of the power gate select transistor 32. Inverter 38 also includes power supply terminals coupled between VDD and the ground terminal GND. Note that signal PG is a logical complement of signal PGB. Signal PGB is active as a logic low.

During a normal operating mode, where the integrated circuit functions to process data at a normal power supply voltage, power gating signal PGB is inactive as a logic high voltage, flip-flops 18, 22, and 26 receive a power supply voltage through conductors 12 and 16, and logic circuits 20 and 22 receive a power supply voltage via conductors 12 and 14. In the illustrated embodiment, the power supply voltage VDD is a positive power supply voltage. The logic high signal PGB causes N-channel transistor 30 to be conductive coupling conductor 14 to the ground terminal GND, thus causing VSS to be substantially at ground potential. Also, the logic high signal PGB causes P-channel transistor 36 to be conductive, causing N-channel transistor 32 to be conductive, thus causing conductor 16 to be coupled to the ground terminal via transistor 32. During normal mode, transistor 32 is configured to function as a pass device. Therefore, during normal operation, both VSS and VSSLR are both substantially ground and the logic circuits 20 and 24 and the flip-flops 18, 22, and 26 receive substantially the same voltage level.

To begin power down, or power gating, mode, the clock signal CLK is stopped, and then signal PGB is asserted as a logic low. The logic low signal PGB causes N-channel transistor 30 to be substantially non-conductive so that conductor 14 is no longer coupled to the ground terminal and is allowed to float. Also, the logic low PGB signal causes P-channel transistor 36 to be substantially non-conductive and N-channel transistor 34 to be conductive. The conductive transistor 34 functions as a shorting device and couples the gate and drain of transistor 32 together causing transistor 32 to function as a diode-connected transistor. The power supply voltage VSSLR on conductor 16 is then offset from ground by a diode threshold voltage drop (VT). The power supply voltage to logic circuits 20 and 24 is turned off, reducing power consumption. Flip-flops 18, 22, and 26 receive the reduced power supply voltage and retain their logic states at the reduced power supply voltage. Because transistor 32 receives a reduced bias voltage, from transistor 34, transistor 32 has a relatively high impedance. The high impedance and the reduced power supply voltage both contribute to reducing a leakage current through the flip-flops during power gating mode.

To handle the relatively high current caused by the operation of a number of flip-flops and logic circuits, transistors 32 and 30 have a relatively large gate width. The size of transistors 30 and 32 depends on how many switching transistors are coupled between the power supply conductors, but transistors 30 and 32 can be many times larger than transistors 34 and 36. For example, in one embodiment, the gate width of transistor 34 may be no greater than 90 percent of the gate width of footer transistor 32. In another embodiment, the gate width of transistor 34 may be no greater than 10 percent of the gate width of transistor 32. In yet another embodiment, the gate width of transistor 34 may be no greater than one percent of the gate width of footer transistor 32. Causing footer transistor 32 to function as a transistor during normal mode and as a diode during power gating mode allows one large transistor to function where two large devices, such as a transistor and a diode, were previously used, thus reducing the size of the integrated circuit. In normal mode, the two devices (transistors 30 and 32) function as low impedance devices. In power gating mode, transistor 32 functions as a high impedance device allowing only a minimal amount of leakage current for the state retention flip-flops to sustain their stored states. Note that the illustrated embodiment describes transistor 32 as being a footer transistor coupled to a ground terminal. However, one of ordinary skill in the art will recognize that the disclosed footer circuit could be implemented as a header circuit coupled to the positive power supply voltage. The header circuit could be used in place of the footer circuit or in addition to the described footer circuit.

Figure 2:
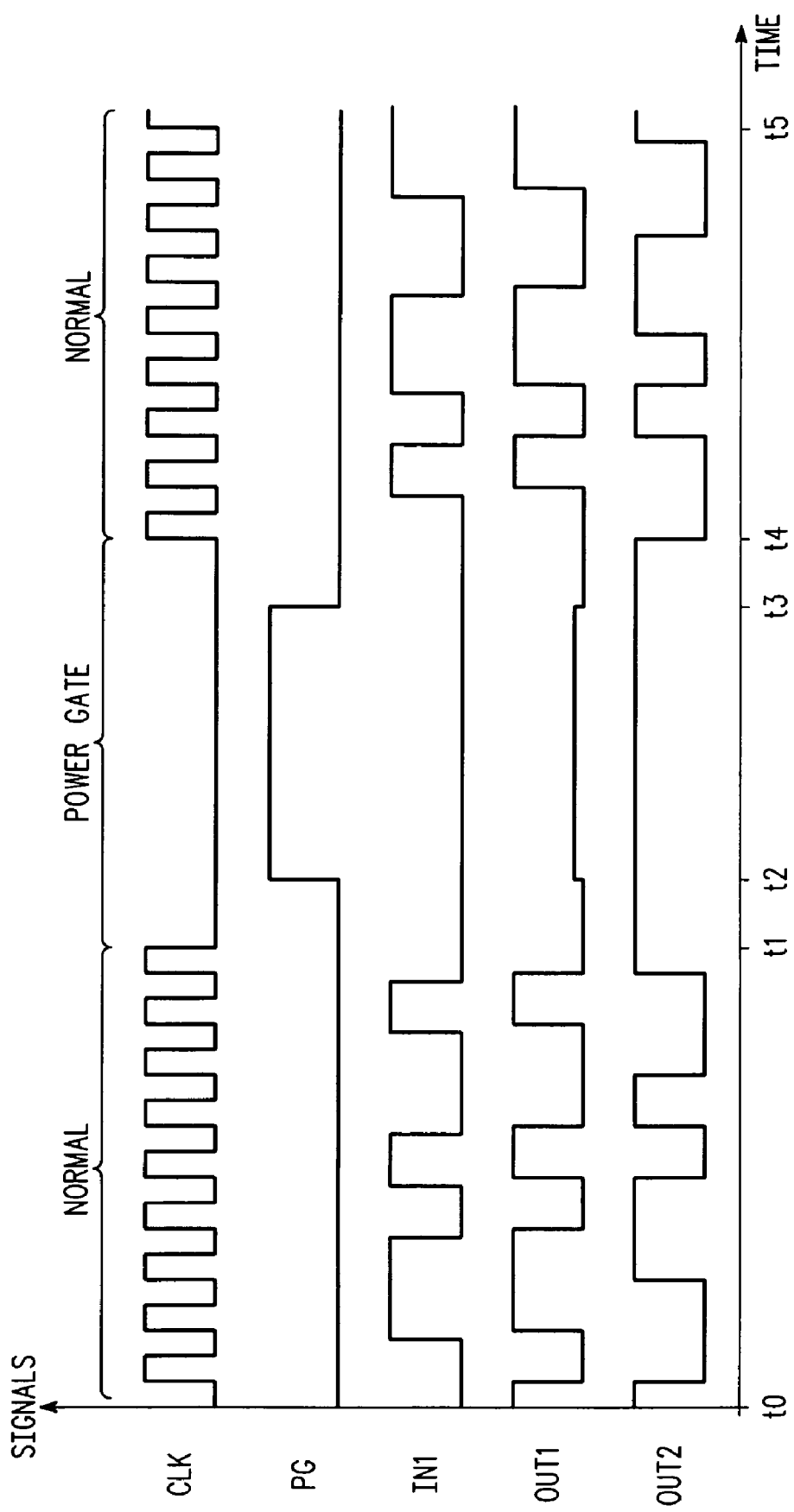
FIG. 2 illustrates waveforms of various signals of the integrated circuit of FIG. 1.

FIG. 2 illustrates waveforms of various signals of the integrated circuit of FIG. 1. In FIG. 2, between times t0 and t1, power gating enable signal PG is inactive as a logic low and the integrated circuit is functioning in a normal operating mode. The clock signal CLK is toggling and signals IN1, OUT1, and OUT2 are changing states. A logic high state is equal to about VDD and a logic low state is equal to about VSS or VSSLR depending on operating mode. The particular states of signals IN1, OUT1, and OUT2 are not important for purposes of the describing the present invention. At time t1, the integrated circuit begins to enter the power gating mode by first stopping clock signal CLK from toggling. In the illustrated embodiment, the clock signal CLK is stopped as a logic low, in other embodiments, clock signal CLK may be stopped as a logic high. At time t2, power gating signal PG is asserted as a logic high. Each of flip-flops 18, 22, and 26 will retain their last logic states. For example, the logic low output signal OUT1 of flip-flop 18 is retained as a logic low, and the logic high output signal OUT2 of flip-flop 22 is retained as a logic high. Note that, as illustrated in FIG. 2, signal OUT1 from flip-flop 22 rises just above zero volts because of the VT drop provided by transistor 32 operating as a diode (see FIG. 1). At time t3, the integrated circuit begins to exit power gating mode and re-enter normal mode by de-asserting PG to become a logic low voltage as shown in FIG. 2. Transistor 34 becomes non-conductive and transistor 36 becomes conductive, causing transistor 32 to resume functioning as a pass transistor instead of a diode. Therefore, the VT rise in signal OUT1 is removed and flip-flops 18, 22, and 26 resume functioning at normal power supply levels. At time t4, clock signal CLK starts toggling again and the integrated circuit resumes functioning in the normal operating mode.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary integrated circuit, this integrated circuit is presented merely to provide a useful reference in discussing various aspects of the invention. Of course, the description of the integrated circuit has been simplified for purposes of discussion, and it is just one of many different types of appropriate circuits that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of circuits or intermedial components. Likewise, any two components so associated can also be viewed as being "operably connected," or "operably coupled," to each other to achieve the desired functionality.

Also for example, in one embodiment, the illustrated elements of circuit 10 are circuitry located on a single integrated circuit or within a same device. Alternatively, circuit 10 may include any number of separate integrated circuits or separate devices interconnected with each other. For example, flip-flop 18 may be located on a same integrated circuit as logic 20 or on a separate integrated circuit or located within another peripheral or slave discretely separate from other elements of circuit 10. Likewise, flip-flop 22 and logic 24 may also be located on separate integrated circuits or devices.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a storage circuit having an input for receiving and storing data and having a first power terminal coupled to a first conductor for receiving a first power supply voltage and having a second power terminal coupled to a second conductor;
   a power gate device having a first terminal coupled to the second conductor, a control terminal for receiving a bias voltage in response to a control signal, and a second terminal coupled to a terminal for receiving a second power supply voltage;
   a shorting device for selectively electrically short circuiting the first terminal of the power gate device to the control terminal of the power gate device in response to the control signal, thereby converting the power gate device from a transistor into a diode-connected device; and
   a logic circuit portion having an input coupled to an output of the storage circuit, the logic circuit portion having a first power terminal coupled to the first conductor and a second power terminal coupled to a third conductor, the storage circuit retaining a state of an input signal to the logic circuit portion when electrical power to the logic circuit portion is gated from at least one of the first power supply voltage and the second power supply voltage in response to the control signal.

2. The circuit of claim 1 further comprising:
   an inverter having an input for receiving the control signal and an output for providing the control signal in inverted form that is coupled to the control terminal of the shorting device;
   a first transistor having a first current electrode for receiving the first power supply voltage, a control electrode coupled to the output of the inverter for receiving the control signal in inverted form and a second current electrode coupled to the control terminal of the power gate device for providing the bias voltage; and
   a second transistor having a first current electrode coupled to the third conductor, a control electrode for receiving the control signal, and a second current electrode coupled to the terminal for receiving the second power supply voltage.

3. The circuit of claim 1 wherein the shorting device further comprises a transistor having a first current electrode connected directly to the first terminal of the power gate device, a control electrode for receiving the control signal, and a second current electrode connected directly to the control electrode of the power gate device.

4. The circuit of claim 3 wherein the control electrode of the shorting device comprises a first width and the control electrode of the power gate device comprises a second width, the first width being no greater than ninety percent of the second width.

5. The circuit of claim 3 wherein the control electrode of the shorting device comprises a first width and the control electrode of the power gate device comprises a second width, the first width being no greater than ten percent of the second width.

6. The circuit of claim 3 wherein the control electrode of the shorting device comprises a first width and the control electrode of the power gate device comprises a second width, the first width being no greater than one percent of the second width.

7. The circuit of claim 1 wherein the power gate device is a footer device for selectively gating a lower magnitude supply voltage of the first power supply voltage and the second power supply voltage to the storage circuit.

8. A method comprising:
   providing a storage circuit having an input for receiving and storing data and having a first power terminal coupled to a first conductor for receiving a first power supply voltage, the storage circuit having a second power terminal coupled to a second conductor;
   providing a power gate device having a first terminal coupled to the second conductor, a control terminal for receiving a bias voltage in response to a control signal, and a second terminal coupled to a terminal for receiving a second power supply voltage;
   selectively electrically short circuiting the first terminal of the power gate device to the control terminal of the power gate device in response to the control signal, thereby converting the power gate device from a transistor into a diode-connected device; and
   coupling an input of a logic circuit portion to an output of the storage circuit, the logic circuit portion having a first power terminal coupled to the first conductor and a second power terminal coupled to a third conductor, the storage circuit retaining a state of an input signal to the logic circuit portion when electrical power to the logic circuit portion is gated from at least one of the first power supply voltage and the second power supply voltage in response to the control signal.

9. The method of claim 8 further comprising:
   providing an inverter for receiving the control signal, the inverter having an output for providing the control signal in inverted form that is coupled to the control terminal of the shorting device;
   providing a first transistor having a first current electrode for receiving the first power supply voltage, a control electrode coupled to the output of the inverter for receiving the control signal in inverted form and a second current electrode coupled to the control terminal of the power gate device for providing the bias voltage; and providing a second transistor having a first current electrode coupled to the third conductor, a control electrode for receiving the control signal, and a second current electrode coupled to the terminal for receiving the second power supply voltage.

10. The method of claim 8 further comprising:
providing a transistor as the shorting device;
connecting a first current electrode of the transistor directly to the first terminal of the power gate device;
providing a control electrode for receiving the control signal; and
connecting a second current electrode of the transistor directly to the control electrode of the power gate device.

11. The method of claim 10 further comprising:
forming the control electrode of the shorting device to have a first width;
forming the control electrode of the power gate device to have a second width; and
forming the first width to be no greater than ninety percent of the second width.

12. The method of claim 10 further comprising:
forming the control electrode of the shorting device to have a first width;
forming the control electrode of the power gate device to have a second width; and
forming the first width to be no greater than ten percent of the second width.

13. The method of claim 10 further comprising:
forming the current electrode of the shorting device to have a first width;
forming the current electrode of the power gate device to have a second width; and
forming the first width to be no greater than one percent of the second width.

14. The method of claim 8 further comprising:
forming the power gate device as a footer device for selectively gating a lower magnitude supply voltage of the first power supply voltage and the second power supply voltage to the storage circuit.

15. A circuit, comprising:
first, second and third power conductors and a voltage terminal;
a storage circuit comprising a first power terminal coupled to the first power conductor and a second power terminal coupled to the second power conductor;
a first power gate select transistor having a first electrode coupled to the second conductor, a control electrode, and a second electrode coupled to the voltage terminal;
a shorting transistor having a first electrode connected directly to the first electrode of the first power gate select transistor, a control electrode, and a second current electrode connected directly to the control electrode of the first power gate select transistor;
an inverter having an input for receiving a control signal and having an output coupled to the control electrode of the first power gate select transistor for providing the control signal after a logic value inversion;
a biasing transistor coupled to the inverter and the control electrode of the power gate select transistor for providing a bias voltage to the first power gate select transistor in response to the control signal; and
a second power gate select transistor comprising a first current electrode coupled to the third power conductor, a second current electrode coupled to the voltage terminal, and a control electrode for receiving the control signal.

16. The circuit of claim 15 wherein the control electrode of the shorting transistor comprises a first width, the control electrode of the first power gate select transistor comprises a second width, and the first width is no greater than ninety percent of the second width.

17. The circuit of claim 15 wherein the control electrode of the shorting transistor comprises a first width, the control electrode of the first power gate select transistor comprises a second width, and the first width is no greater than ten percent of the second width.

18. The circuit of claim 15 wherein the control electrode of the shorting transistor comprises a first width, the control electrode of the first power gate select transistor comprises a second width, and the first width is no greater than one percent of the second width.

* * * * *